(12) United States Patent
Bae et al.

(10) Patent No.: US 12,284,758 B2
(45) Date of Patent: Apr. 22, 2025

(54) PRINTED CIRCUIT BOARD

(71) Applicant: SAMSUNG ELECTRO-MECHANICS CO., LTD., Suwon-si (KR)

(72) Inventors: Tae Kyun Bae, Suwon-si (KR); Hwan Su Yoo, Suwon-si (KR); Suk Chang Hong, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 239 days.

(21) Appl. No.: 18/113,828

(22) Filed: Feb. 24, 2023

(65) Prior Publication Data

US 2024/0074049 A1 Feb. 29, 2024

(30) Foreign Application Priority Data

Aug. 31, 2022 (KR) .......................... 10-2022-0109820

(51) Int. Cl.
*H05K 1/18* (2006.01)
*H05K 1/11* (2006.01)

(52) U.S. Cl.
CPC ............. *H05K 1/111* (2013.01); *H05K 1/181* (2013.01); *H05K 2201/096* (2013.01); *H05K 2201/09827* (2013.01); *H05K 2201/10674* (2013.01); *H05K 2201/2081* (2013.01)

(58) Field of Classification Search
CPC .. H05K 1/111; H05K 1/181; H05K 2201/096; H05K 2201/09827; H05K 2201/10674; H05K 2201/2081
USPC ......................................................... 361/783
See application file for complete search history.

(56) References Cited

U.S. PATENT DOCUMENTS

| 2002/0195696 | A1 | 12/2002 | Yoneda | |
| 2015/0092356 | A1* | 4/2015 | Yoshikawa | .......... H05K 3/4007 |
| | | | | 174/258 |
| 2017/0303396 | A1* | 10/2017 | Nishioka | .............. H05K 3/0055 |
| 2023/0328886 | A1* | 10/2023 | Shin | ..................... H01L 21/4857 |
| | | | | 174/260 |
| 2024/0381530 | A1* | 11/2024 | Na | .......................... H05K 3/34 |

FOREIGN PATENT DOCUMENTS

| JP | 2004-207381 A | 7/2004 |
| KR | 10-2002-0097036 A | 12/2002 |

* cited by examiner

*Primary Examiner* — Binh B Tran
(74) *Attorney, Agent, or Firm* — Morgan, Lewis & Bockius LLP

(57) ABSTRACT

A printed circuit board includes: an insulating layer; first and second pads respectively disposed on an upper surface of the insulating layer; and a solder resist layer disposed on the upper surface of the insulating layer, and having first and second openings at least partially exposing the first and second pads, respectively, wherein the solder resist layer contacts a side surface of the first pad, and the solder resist layer is spaced apart from the second pad.

24 Claims, 3 Drawing Sheets

PRINTED CIRCUIT BOARD

CROSS-REFERENCE TO RELATED APPLICATION(S)

This application claims benefit of priority to Korean Patent Application No. 10-2022-0109820 filed on Aug. 31, 2022 in the Korean Intellectual Property Office, the disclosure of which is incorporated herein by reference in its entirety.

TECHNICAL FIELD

The present disclosure relates to a printed circuit board.

BACKGROUND

As a difference in height between a solder resist layer and an external connection pad decreases in accordance with a decrease in thickness of a memory substrate, yield and reliability problems caused because a surface of the external connection pad is contaminated in an assembly process have become important. In particular, for hybrid printed circuit boards, research into designing and manufacturing boards to ensure reliability of connection in a flip chip manner and in a wire bonding manner is ongoing.

SUMMARY

An aspect of the present disclosure may provide a printed circuit board capable of improving reliability of a connection by selectively controlling thicknesses of external connection pads for connection in a flip chip manner and in a wire bonding manner.

According to an aspect of the present disclosure, a printed circuit board may include: an insulating layer; first and second pads respectively disposed on an upper surface of the insulating layer; and a solder resist layer disposed on the upper surface of the insulating layer, and having first and second openings at least partially exposing the first and second pads, respectively. The solder resist layer may contact a side surface of the first pad, and the solder resist layer may be spaced apart from the second pad.

According to another aspect of the present disclosure, a printed circuit board may include: an insulating layer; a plurality of first pads disposed on a first connection region of an upper surface of the insulating layer; and a plurality of second pads disposed on a second connection region of the upper surface of the insulating layer. Each of the plurality of first pads may have a greater thickness than each of the plurality of second pads.

According to another aspect of the present disclosure, a printed circuit board may include: an insulating layer; and a first pad and a second pad including a same material, disposed on an upper surface of the insulating layer, and spaced apart from each other. An upper surface of the same material of the second pad may be closer to the upper surface of the insulating layer than an upper surface of the same material of the first pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will now be described in detail with reference to the accompanying drawings.

Printed Circuit Board

Figure 1:
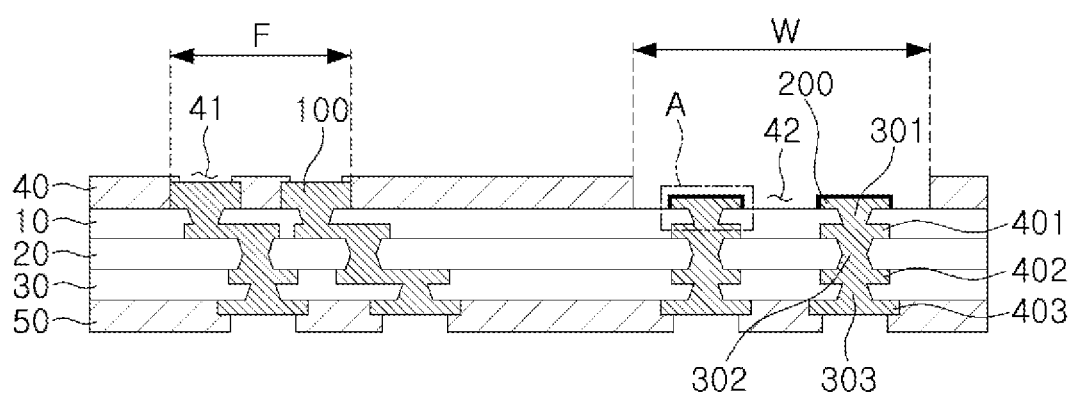
FIG. 1 is a schematic cross-sectional view illustrating a cross section of a printed circuit board according to an exemplary embodiment of the present disclosure.

FIG. 1 is a schematic cross-sectional view illustrating a cross section of a printed circuit board according to an exemplary embodiment of the present disclosure.

Referring to FIG. 1, a printed circuit board 1 according to an exemplary embodiment of the present disclosure includes an insulating layer 10, a first pad 100 and a second pad 200 respectively disposed on an upper surface of the insulating layer 10, a first solder resist layer 40 disposed on the upper surface of the insulating layer 10 and having a first opening 41 and a second opening 42 at least partially exposing the first pad 100 and the second pad 200, respectively.

Meanwhile, the first solder resist layer 40 may contact a side surface of the first pad 100, and the first solder resist layer 40 may not contact the second pad 200. That is, the first solder resist layer 40 may contact the side surface of the first pad 100, because the first opening 41 of the first solder resist layer 40 has a shorter width than the first pad 100. In addition, the first solder resist layer 40 may not contact the second pad 200, because the second opening 42 of the first solder resist layer 40 has a longer width than the second pad 200. In other words, a solder resist opening (SRO) may be formed in the first solder resist layer 40 for the first pad 100 to contact the first solder resist layer 40, and another SRO may be formed in the first solder resist layer 40 for the second pad 200 to not contact the first solder resist layer 40.

Meanwhile, the printed circuit board 1 according to an exemplary embodiment may further include a surface treatment layer 250 covering an upper surface and a side surface of the second pad 200. By applying the surface treatment layer 250 to the upper surface and the side surface of the second pad 200, it is possible to improve reliability in connecting the pad to an electronic component in a wire bonding manner.

Meanwhile, as will be described below, the surface treatment layer 250 may include a first metal layer 251 containing nickel (Ni) in contact with the second pad 200 and a second metal layer 252 containing gold (Au) in contact with the first metal layer 251.

Meanwhile, the printed circuit board 1 according to an exemplary embodiment may further include a first semiconductor chip 2 disposed above the first opening 41 and bonded to the first pad 100 by a flip chip, and a second semiconductor chip 3 disposed on an upper surface of the first solder resist layer 40 and bonded to the second pad 200 by a wire. Hereinafter, a pad connected to a semiconductor chip in a flip chip manner will be referred to as a "flip chip pad" for convenience, and a pad connected to a semiconductor chip in a wire bonding manner will be referred to as a "wire bonding pad" for convenience.

Meanwhile, the first pad 100 and the second pad 200 may protrude from the upper surface of the insulating layer 10.

That is, each of the first pad 100 and the second pad 200 may be disposed on the upper surface of the insulating layer 10 and may not be buried in the insulating layer 10.

Meanwhile, the first opening 41 of the first solder resist layer 40 may at least partially expose an upper surface of the first pad 100 for electrical connection with an electronic component. The upper surface of the first pad 100 may be located lower than the upper surface of the first solder resist layer 40. That is, a partial portion of the first pad 100 may be disposed inside the first opening 41. Accordingly, the first solder resist layer 40 may at least partially cover the upper surface of the first pad 100.

On the other hand, the second opening 42 may expose the upper surface and the side surface of the second pad 200 for electrical connection with an electronic component. The upper surface of the second pad 200 may be located within the second opening 42. The second opening 42 may at least partially expose the upper surface of the insulating layer 10.

Meanwhile, the upper surface of the first pad 100 may be located higher than the upper surface of the second pad 200. As will be described below, this may be because each of the first pad 100 and the second pad 200 is disposed on the upper surface of the insulating layer 10, and the first pad 100 has a greater thickness than the second pad 200.

Meanwhile, a plurality of first pads 100 and a plurality of second pads 200 may be disposed on the upper surface of the insulating layer 100.

Meanwhile, the plurality of first pads 100 and the plurality of second pads 200 may be disposed in a first connection region F and a second connection region W, respectively, on the upper surface of the insulating layer 100. That is, the plurality of first pads 100 may be disposed in the first connection region F on the upper surface of the insulating layer 100, and the plurality of second pads 200 may be disposed in the second connection region W on the upper surface of the insulating layer 100. The plurality of first pads 100 disposed in the first connection region F may be bonded to the first semiconductor chip 2 by flip chips, and the plurality of second pads 200 disposed in the second connection region W may be bonded to the second semiconductor chip 3 by wires, but the plurality of first pads 100 and the plurality of second pads 200 are not limited thereto.

Meanwhile, each of the plurality of first pads 100 disposed in the first connection region F may have a greater thickness than each of the plurality of second pads 200 disposed in the second connection region W. In a case in which an external connection pad is connected to a semiconductor chip in a flip chip manner, since Cu consumption occurs in the flip chip pad during a reflow process, the flip chip pad preferably has a thickness of 10 μm or more. On the other hand, in a case in which an external connection pad is connected to a semiconductor chip in a wire bonding manner, the wire bonding pad needs to form a step with the upper surface of the solder resist layer, that is, implement a relatively smaller thickness than the solder resist layer, in order to prevent contamination on the surface of the pad.

Therefore, in a hybrid printed circuit board capable of mounting electronic components both in a flip chip manner and in a wire bonding manner, a flip chip pad may have a greater thickness than a wire bonding pad. In this case, reliability is ensured both in the flip chip manner and in the wire bonding manner.

Meanwhile, the plurality of first pads 100 disposed in the first connection region F may have a greater thickness than wiring layers 401, 402, and 403, which will be described below, and the plurality of second pads 200 disposed in the second connection region W may have a smaller thickness than the wiring layers 401, 402, and 403.

Meanwhile, the plurality of first pads 100 disposed in the first connection region F may have substantially the same thickness, and the plurality of second pads 200 disposed in the second connection region W may have substantially the same thickness. The meaning of the term "substantially" may include a process error occurring in the manufacturing process, a measurement error, or the like, recognizable by one of ordinary skill in the art. For example, the configuration in which elements have substantially the same thickness may include the example in which the elements have exactly the same thickness, and also the example in which a minute difference in thickness may exist due to a process error occurring in the manufacturing process, a measurement error, or the like, recognizable by one of ordinary skill in the art.

Meanwhile, the first connection region F and the second connection region W may not overlap each other.

Meanwhile, a smallest of intervals between the plurality of first pads 100 and the plurality of second pads 200 may be larger than a smallest of intervals between the plurality of first pads 100 and a smallest of intervals between the plurality of second pads 200. This may be because the first connection region F and the second connection region W are regions for connecting the first semiconductor chip 2 and the second semiconductor chip 3, respectively, and the first connection region F and the second connection region W are spaced apart from each other, and may be because the solder resist openings in the first solder resist layer 40 satisfy a small bump pitch.

Meanwhile, the first opening 41 and the second opening 42 may at least partially expose each of the plurality of first pads 100 and each of the plurality of second pads 200, respectively. Specifically, the first solder resist layer 40 may have a plurality of first openings 41 at least partially exposing the plurality of first pads 100, respectively. That is, since the plurality of first pads 100 and the plurality of second pads 200 may be disposed on the upper surface of the insulating layer 100 as described above, the plurality of first openings 41 may be formed to expose the plurality of first pads 100. The number of second openings 42 may be one, but is not limited thereto.

Meanwhile, a partial portion of the first solder resist layer 40 may be interposed between the plurality of first pads 100. This may be because the first solder resist layer 40 has a plurality of first openings 41 for exposing the plurality of first pads 100, respectively.

Meanwhile, the second opening 42 may expose side surfaces and upper surfaces of two or more second pads 200 among the plurality of second pads 200. This may be because the two or more second pads 200 are disposed within the second opening 42.

Meanwhile, the first semiconductor chip 2 may be disposed on the first connection region F and bonded to the plurality of first pads 100 by flip chips, and the second semiconductor chip 3 may be disposed on the upper surface of the first solder resist layer 40 and bonded to the plurality of second pads 200 by wires.

Meanwhile, the printed circuit board 1 according to an exemplary embodiment may be configured by stacking a plurality of insulating layers 10, 20, and 30, and the first pad 100 and the second pad 200 may be formed on the insulating layer 10, the outermost layer of the printed circuit board 1, to be connected to an external semiconductor chip. That is, as illustrated in FIG. 1, in the printed circuit board 1 according to an exemplary embodiment, a plurality of insulating layers 20 and 30 and a plurality of circuit layers 402 and 403 may be stacked alternately under the insulating layer 10, which is the outermost layer, and the circuit layers 401, 402, and 403 and the pads 100 and 200 may be electrically connected to each other through vias 301, 302, and 303 formed in the insulating layers. Specifically, the printed circuit board 1 according to an exemplary embodiment may have a structure in which the first insulating layer 10 and the third insulating layer 30 are built up on the core insulating layer 20, and each of the first and third insulating layers 10 and 30 may include a plurality of insulating layers, but is not limited thereto.

Meanwhile, the printed circuit board 1 according to an exemplary embodiment may further include a second solder resist layer 50 disposed on a side opposite to the side on which the first solder resist layer 40 is disposed on the first insulating layer 10. For example, the second solder resist layer 50 may be disposed on a lower surface of the third insulating layer 30 and may at least partially cover the wiring layer 403 disposed on the lowermost side among the plurality of wiring layers 401, 402, and 403. By doing so, the lower side of the printed circuit board 1 can be protected.

Hereinafter, the components of the printed circuit board 1 according to an exemplary embodiment will be described in more detail with reference to drawings.

The insulating layers 10, 20, and 30 may include an insulating material. Examples of insulating materials include, but are not limited to, a thermosetting resin such as an epoxy resin, a thermoplastic resin such as polyimide, a material in which the thermosetting or thermoplastic resin is mixed with an inorganic filler such as silica, and a resin in which the thermosetting or thermoplastic resin is impregnated together with an inorganic filler in a core material such as a glass fiber, a glass cloth, or a glass fabric, for example, a copper clad laminate (CCL).

In a case in which the printed circuit board 1 according to an exemplary embodiment includes a core insulating layer, the core insulating layer may also include an insulating material. Examples of insulating materials applicable therefor include, but are not limited to, a thermosetting resin such as an epoxy resin, a thermoplastic resin such as polyimide, a material in which the thermosetting or thermoplastic resin is mixed with an inorganic filler such as silica, and a resin in which the thermosetting or thermoplastic resin is impregnated together with an inorganic filler in a core material such as a glass fiber, a glass cloth, or a glass fabric, for example, a copper clad laminate (CCL). The core insulating layer may have a greater thickness than each of the build-up insulating layers, but is not limited thereto. The thickness may be measured, with respect to a cross section of the printed circuit board obtained by polishing or cutting the printed circuit board, using a scanning microscope or an optical microscope, e.g., an optical microscope (×1000) manufactured by Olympus. If the thickness is not uniform, an average value of thicknesses measured at five random points may be used for comparison.

The solder resist layers 40 and 50 may include an insulating material, and a liquid-type or film-type solder resist may be used as the insulating material. However, the insulating material of the solder resist layers 40 and 50 is not limited thereto, and another type of material may be used. The first solder resist layer 40 may include a plurality of layers, and the plurality of layers may have a clear boundary therebetween or may be integrated and have an ambiguous boundary therebetween. In the solder resist layer, a solder resist opening (SRO) may be formed as an electrical connection path to which a connection means such as a solder or a bump is coupled. Specifically, the first solder resist layer 40 may include first and second openings 41 and 42.

The first pad 100 and the second pad 200, which are external connection pads electrically connected to semiconductor chips to form a package, and may be conductive metal layers formed by electroplating, chemical plating, or sputtering, and may be formed of copper (Cu), but is not limited thereto. The first pad 100 may be electrically connected to a semiconductor chip in a flip chip manner to form a package, and the second pad 200 may be electrically connected to a semiconductor chip in a wire bonding manner to form a package, but the first pad 100 and the second pad 200 are not limited thereto.

Each of the wiring layers 401, 402, and 403 may include a metal material. Examples of metal materials applicable therefor include copper (Cu), aluminum (Al), silver (Ag), tin (Sn), gold (Au), nickel (Ni), lead (Pb), titanium (Ti), or alloys thereof. Each of the wiring layers 401, 402, and 403 may include an electroless plating layer (or chemical copper) and an electrolytic plating layer (or electrolytic copper), but is not limited thereto. As the electroless plating layer, a sputtering layer may be formed instead of the chemical copper. If necessary, each of the wiring layers 401, 402, and 403 may further include a copper foil. The wiring layers 401, 402, and 403 may perform various functions depending on how the respective layers are designed. For example, the wiring layers 401, 402, and 403 may include ground patterns, power patterns, signal patterns, and the like. Here, the signal patterns may include various signals, e.g., data signals, other than ground patterns, power patterns, and the like. Each of these patterns may include a line pattern, a plane pattern, and/or a pad pattern.

As a material of the plurality of vias 301, 302, and 303, a metal material, such as copper (Cu), aluminum (Al), silver (Ag), tin (Sn), gold (Au), nickel (Ni), lead (Pb), titanium (Ti), or alloys thereof, may be used. Each of the plurality of vias 301, 302, and 303 may include an electroless plating layer (or chemical copper) and an electrolytic plating layer (or electrolytic copper), but is not limited thereto. As the electroless plating layer, a sputtering layer may be formed instead of the chemical copper. The build-up vias 301 and 303 may perform various functions depending on how the corresponding layers are designed. For example, the build-up vias 301 and 303 may include ground vias, power vias, signal vias, and the like. Here, the signal vias may include vias for transmitting various signals, e.g., data signals, other than ground vias, power vias, and the like.

In a case in which the printed circuit board 1 according to an exemplary embodiment includes a core insulating layer, the printed circuit board 1 may include core vias, and the core vias may include a through via penetrating through the core insulating layer. The through via may include a metal layer formed on a wall surface of the through hole and a plug filling the metal layer. The metal layer may include a metal material such as copper (Cu), aluminum (Al), silver (Ag), tin (Sn), gold (Au), nickel (Ni), lead (Pb), titanium (Ti), or alloys thereof. The plug may include ink made of an insulating material. The metal layer may include an electroless plating layer (or chemical copper) and an electrolytic plating layer (or electrolytic copper), but is not limited thereto. As the electroless plating layer, a sputtering layer may be formed instead of the chemical copper. The core vias may perform various functions depending on how the core insulating layer is designed. For example, the core vias may include ground vias, power vias, signal vias, and the like.

Here, the signal vias may include vias for transmitting various signals, e.g., data signals, other than ground vias, power vias, and the like.

Figure 2:
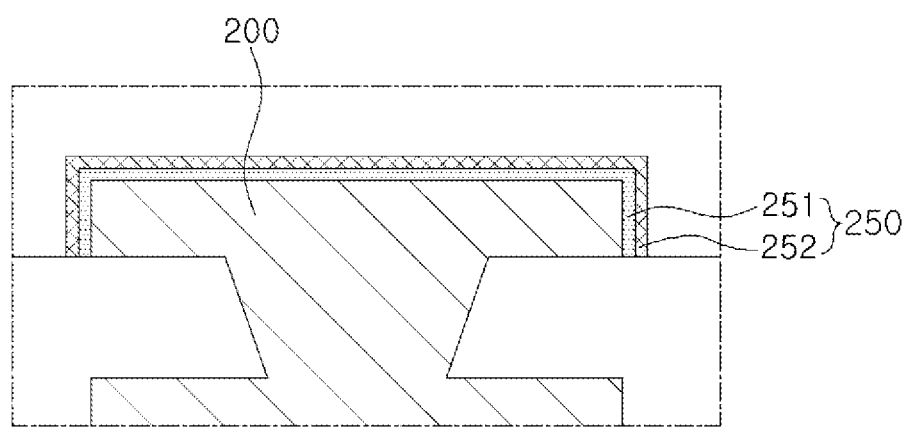
FIG. 2 is a schematic enlarged view illustrating portion A of the printed circuit board of FIG. 1.

FIG. 2 is a schematic enlarged view illustrating portion A of the printed circuit board of FIG. 1.

Referring to FIG. 2, the surface treatment layer 250 may include a first metal layer 251 containing nickel (Ni) in contact with the second pad 200, and a second metal layer 252 containing gold (Au) in contact with the first metal layer 251. The first metal layer 251 is not particularly limited as long as it is a metal layer that can be electrically connected to the second pad 200 on the insulating layer 10. In addition, the second metal layer 252 may be a metal layer formed by plating using gold (Au) so that the second pad 200 is advantageous in electrical connection to a semiconductor chip to form a package, but is not limited thereto.

Figure 3:
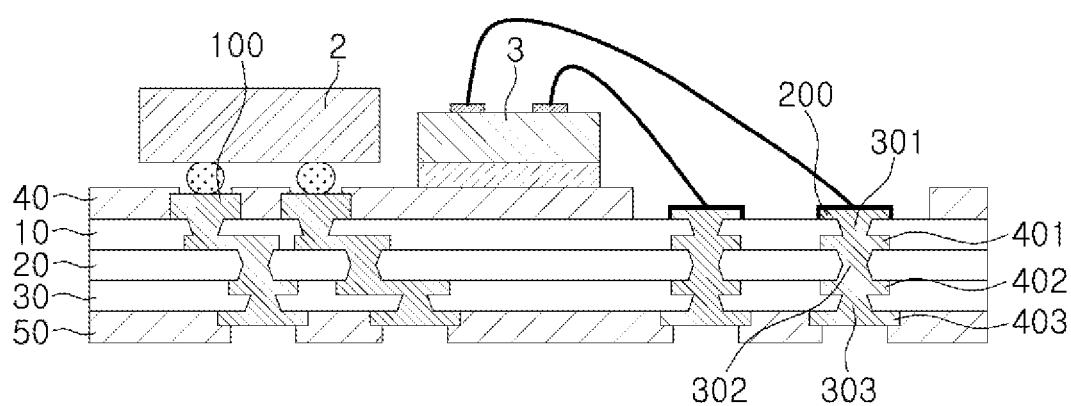
FIG. 3 is a schematic view illustrating a printed circuit board according to an exemplary embodiment of the present disclosure in a state where the printed circuit board is coupled to semiconductor chips.

FIG. 3 is a schematic view illustrating a printed circuit board according to an exemplary embodiment of the present disclosure in a state where the printed circuit board is coupled to semiconductor chips.

Referring to FIG. 3, a printed circuit board 5 according to an exemplary embodiment of the present disclosure may be electrically connected to the first semiconductor chip 2 and the second semiconductor chip 3. Specifically, the first pad 100 may be connected to the first semiconductor chip 2 by a flip chip manner through solders, and the second pad 200 may be connected to the second semiconductor chip 3 in a wire bonding manner through wires, but the first pad 100 and the second pad 200 are not limited thereto.

Each of the semiconductor chips 2 and 3 may include an integrated circuit (IC) die in which hundreds to millions of devices or more are integrated into the single chip. In this case, the integrated circuit may be, for example, a logic chip such as a central processor (e.g., a CPU), a graphic processor (e.g., a GPU), a field programmable gate array (FPGA), a digital signal processor, a cryptographic processor, a microprocessor, a microcontroller, an application processor (e.g., an AP), an analog-to-digital converter, or an application-specific IC (ASIC), but is not limited thereto. The integrated circuit may be a memory chip such as a volatile memory (e.g., a DRAM), a non-volatile memory (e.g., a ROM), a flash memory, or a high bandwidth memory (HBM), or another type of chip such as a power management IC (PMIC).

The semiconductor chips 2 and 3 may be formed based on an active wafer. In this case, silicon (Si), germanium (Ge), gallium arsenide (GaAs), or the like may be used as a base material forming a body of each of the semiconductor chips 2 and 3. Various circuits may be formed in the body. A connection pad may be formed on each body, and the connection pad may include a conductive material such as aluminum (Al) or copper (Cu). The semiconductor chips 2 and 3 may be bare dies, and in this case, metal bumps may be disposed on connection pads. The semiconductor chips 2 and 3 may be packaged dies, and in this case, re-wiring layers may be additionally formed on connection pads, and metal bumps may be disposed on the re-wiring layers.

Solders may enable the semiconductor chip 2 to be mounted on the printed circuit board 5. The solders may be formed of a low melting point metal, e.g., tin (Sn)-aluminum (Al)-copper (Cu), and may be in a bump or ball type. However, this is merely an example, and the semiconductor chip 2 does not necessarily need to be mounted through solders.

As set forth above, according to the exemplary embodiment in the present disclosure, it is possible to provide a printed circuit board capable of improving reliability of connection in the flip chip manner and in the wire bonding manner.

While exemplary embodiments have been shown and described above, it will be apparent to those skilled in the art that modifications and variations could be made without departing from the scope of the present invention as defined by the appended claims.

What is claimed is:

1. A printed circuit board comprising:
an insulating layer;
first and second pads respectively disposed on an upper surface of the insulating layer; and
a solder resist layer disposed on the upper surface of the insulating layer, and having first and second openings at least partially exposing the first and second pads, respectively,
wherein the solder resist layer contacts a side surface of the first pad,
the solder resist layer is spaced apart from the second pad, and
an upper surface of the first pad is located higher than an upper surface of the second pad without being located higher than an upper surface of the solder resist layer.

2. The printed circuit board of claim 1, wherein the first and second pads protrude from the upper surface of the insulating layer.

3. The printed circuit board of claim 1, wherein the solder resist layer at least partially covers an upper surface of the first pad, and
the first opening at least partially exposes the upper surface of the first pad.

4. The printed circuit board of claim 1, wherein the second opening exposes an upper surface and a side surface of the second pad.

5. The printed circuit board of claim 4, wherein the second opening at least partially exposes the upper surface of the insulating layer.

6. The printed circuit board of claim 1, further comprising a surface treatment layer covering an upper surface and a side surface of the second pad.

7. The printed circuit board of claim 6, wherein the surface treatment layer includes a first metal layer containing nickel (Ni) in contact with the second pad, and a second metal layer containing gold (Au) in contact with the first metal layer.

8. The printed circuit board of claim 1, further comprising:
a first semiconductor chip disposed above the first opening, and bonded to the first pad by a flip chip; and
a second semiconductor chip disposed on an upper surface of the solder resist layer, and bonded to the second pad by a wire.

9. A printed circuit board comprising:
an insulating layer;
a plurality of first pads disposed on a first connection region of an upper surface of the insulating layer;
a plurality of second pads disposed on a second connection region of the upper surface of the insulating layer; and
a solder resist layer disposed on the upper surface of the insulating layer,
wherein each of the plurality of first pads has a greater thickness than each of the plurality of second pads, and
an upper surface of each of the plurality of first pads is located higher than an upper surface of each of the plurality of second pads without being located higher than an upper surface of the solder resist layer.

10. The printed circuit board of claim 9, wherein the plurality of first pads have substantially the same thickness, and the plurality of second pads have substantially the same thickness.

11. The printed circuit board of claim 9, wherein a smallest of intervals between the plurality of first pads and the plurality of second pads is larger than a smallest of intervals between the plurality of first pads and a smallest of intervals between the plurality of second pads.

12. The printed circuit board of claim 9,
wherein the solder resist layer has a plurality of first openings at least partially exposing the plurality of first pads, respectively.

13. The printed circuit board of claim 12, wherein a partial portion of the solder resist layer is interposed between the plurality of first pads.

14. The printed circuit board of claim 12, wherein the solder resist layer further has a second opening, and
the second opening exposes side surfaces and upper surfaces of two or more second pads among the plurality of second pads.

15. The printed circuit board of claim 12, further comprising:
a first semiconductor chip disposed above the first connection region, and bonded to the plurality of first pads by flip chips; and
a second semiconductor chip disposed on an upper surface of the solder resist layer, and bonded to the plurality of second pads by wires.

16. A printed circuit board comprising:
an insulating layer;
a first pad and a second pad including a same material, disposed on an upper surface of the insulating layer, and spaced apart from each other; and
a solder resist layer disposed on the insulating layer, wherein an upper surface of the same material of the second pad is closer to the upper surface of the insulating layer than an upper surface of the same material of the first pad, and
an upper surface of the first pad is located higher than an upper surface of the second pad without being located higher than an upper surface of the solder resist layer.

17. The printed circuit board of claim 16, wherein the same material is copper (Cu).

18. The printed circuit board of claim 16, wherein the first and second pads protrude from the upper surface of the insulating layer.

19. The printed circuit board of claim 16, wherein the solder resist layer covers only a portion of the first pad and is spaced apart from the second pad.

20. The printed circuit board of claim 19, further comprising:
a first semiconductor chip bonded to the first pad by a flip chip; and
a second semiconductor chip disposed on the solder resist layer, and bonded to the second pad by a wire.

21. The printed circuit board of claim 16, further comprising a surface treatment layer covering at least a portion of the second pad.

22. The printed circuit board of claim 21, wherein among the first pad and the second pad, the surface treatment layer covers only the second pad.

23. The printed circuit board of claim 21, wherein the surface treatment layer includes a first metal layer containing nickel (Ni) in contact with the second pad, and a second metal layer containing gold (Au) in contact with the first metal layer.

24. The printed circuit board of claim 21, wherein an upper surface of the second metal layer is closer to the upper surface of the insulating layer than the upper surface of the same material of the first pad.

* * * * *